(12) United States Patent
Iwase

(10) Patent No.: US 11,450,835 B2
(45) Date of Patent: Sep. 20, 2022

(54) GAS BARRIER FILM, OPTICAL ELEMENT INCLUDING GAS BARRIER FILM, AND METHOD FOR PRODUCING GAS BARRIER FILM

(71) Applicant: FUJIFILM Corporation, Tokyo (JP)

(72) Inventor: Eijiro Iwase, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 231 days.

(21) Appl. No.: 16/926,941

(22) Filed: Jul. 13, 2020

(65) Prior Publication Data

US 2020/0343484 A1    Oct. 29, 2020

Related U.S. Application Data

(63) Continuation of application No. PCT/JP2019/002831, filed on Jan. 29, 2019.

(30) Foreign Application Priority Data

Mar. 5, 2018 (JP) .............................. JP2018-038781

(51) Int. Cl.
*H01L 29/08* (2006.01)
*H01L 51/52* (2006.01)
*C23C 16/34* (2006.01)
*C23C 16/50* (2006.01)
*H01L 27/32* (2006.01)
(Continued)

(52) U.S. Cl.
CPC ........ *H01L 51/5253* (2013.01); *C23C 16/345* (2013.01); *C23C 16/50* (2013.01); *H01L 27/3244* (2013.01); *H01L 51/003* (2013.01); *H01L 51/56* (2013.01); *H01L 2227/326* (2013.01)

(58) Field of Classification Search
CPC .................................................. H01L 51/5253
See application file for complete search history.

(56) References Cited

U.S. PATENT DOCUMENTS 9,203,051 B2 * 12/2015 Byun .................. H01L 51/5253
9,682,534 B1 *  6/2017 Young .................. B32B 11/046
(Continued)

FOREIGN PATENT DOCUMENTS

JP          8-234181 A     9/1996
JP       2001-205768 A     7/2001
(Continued)

OTHER PUBLICATIONS

Japanese Office Action for corresponding Japanese Application No. 2020-504850, dated Jun. 1, 2021, with English translation.
(Continued)

*Primary Examiner* — Caleb E Henry
(74) *Attorney, Agent, or Firm* — Birch, Stewart, Kolasch & Birch, LLP

(57) ABSTRACT

A gas barrier film includes a substrate, a peeling resin layer from which the substrate can be peeled off, one or more inorganic layers, and an adhesive layer provided on an inorganic layer most spaced from the substrate, in which an inorganic layer is provided on a surface of the peeling resin layer, the peeling resin layer is a resin layer including a phenyl group, and the adhesive layer is solid at normal temperature and has fluidity by heating, thereby exhibiting adhesiveness.

18 Claims, 3 Drawing Sheets

(51) Int. Cl.
*H01L 51/00* (2006.01)
*H01L 51/56* (2006.01)

(56) References Cited

U.S. PATENT DOCUMENTS

| | | | |
|---|---|---|---|
| 10,780,675 B2 * | 9/2020 | Ueno | .................. C08J 7/042 |
| 10,868,265 B2 * | 12/2020 | Gu | .................. H01L 51/0097 |
| 2014/0308494 A1 * | 10/2014 | Iwaya | .................. H01L 51/003 |
| | | | 428/419 |

FOREIGN PATENT DOCUMENTS

| | | |
|---|---|---|
| JP | 2007-118564 A | 5/2007 |
| JP | 2017-43058 A | 3/2017 |
| JP | 2017-43060 A | 3/2017 |
| WO | WO 2013/065812 A1 | 5/2013 |
| WO | WO 2014/163189 A1 | 10/2014 |
| WO | WO 2015/159887 A1 | 10/2015 |

OTHER PUBLICATIONS

International Preliminary Report on Patentability and Written Opinion of the International Searching Authority, with an English translation (forms PCT/IB/373 and PCT/ISA/237), dated Sep. 8, 2020, for corresponding International Application No. PCT/JP2019/002831.

International Search Report (forms PCT/ISA/210 and PCT/ISA/220), dated Apr. 23. 2019, for corresponding International Application No. PCT/JP2019/002831, with an English translation.

\* cited by examiner

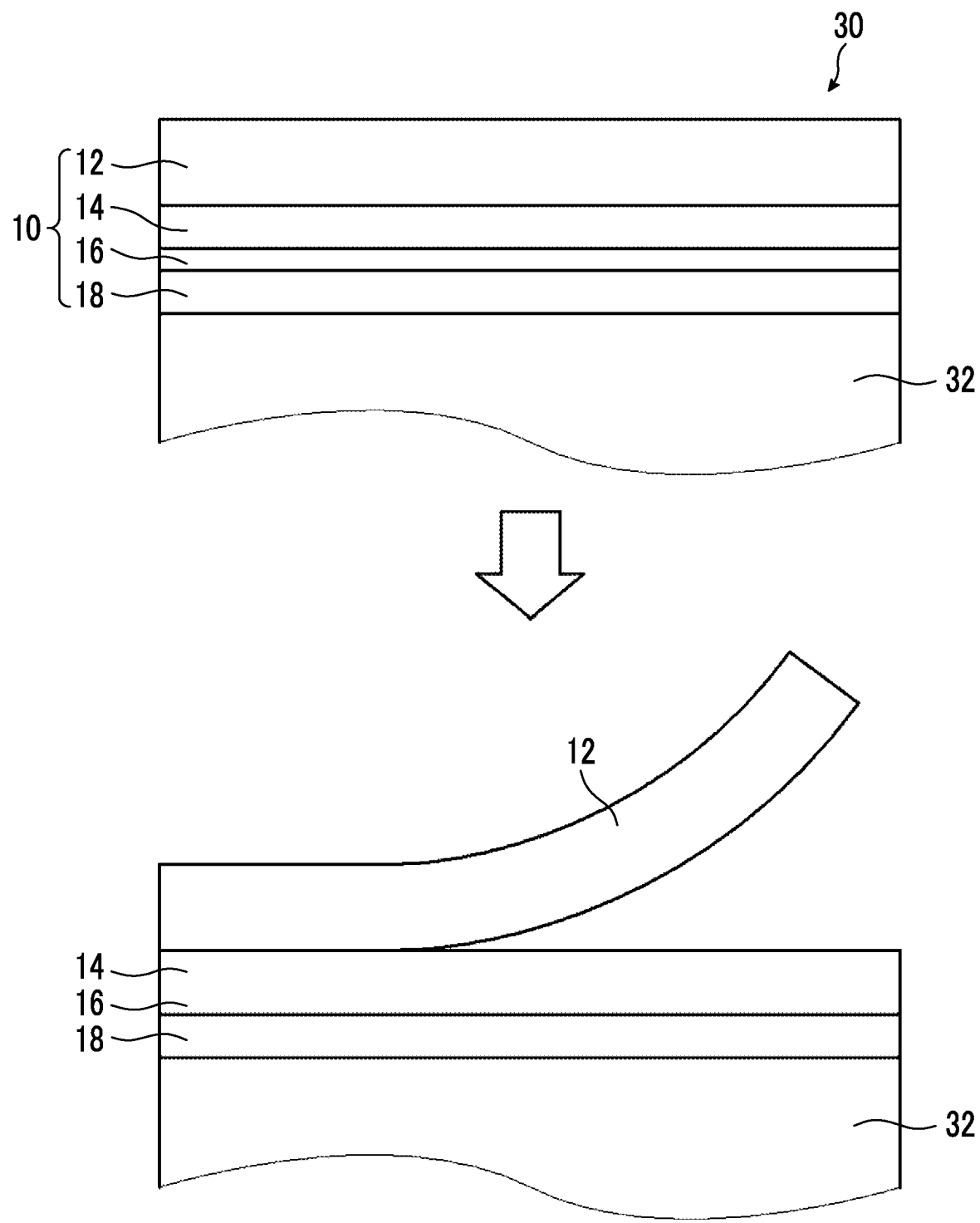

GAS BARRIER FILM, OPTICAL ELEMENT INCLUDING GAS BARRIER FILM, AND METHOD FOR PRODUCING GAS BARRIER FILM

CROSS-REFERENCE TO RELATED APPLICATIONS

This application is a Continuation of PCT International Application No. PCT/JP2019/002831 filed on Jan. 29, 2019, which claims priority under 35 U.S.C. § 119(a) to Japanese Patent Application No. 2018-038781 filed on Mar. 5, 2018. Each of the above application(s) is hereby expressly incorporated by reference, in its entirety, into the present application.

BACKGROUND OF THE INVENTION

1. Field of the Invention

The present invention relates to a gas barrier film, an optical element formed of the gas barrier film, and a producing method for producing the gas barrier film.

2. Description of the Related Art

In recent years, high gas barrier performance is required for optical elements (optical devices) such as an organic electroluminescence (EL) element, a solar cell, a quantum dot film, and a display material, packaging materials such as an infusion bag containing a chemical agent which are altered by moisture or oxygen, and the like.

Therefore, necessary gas barrier performance is imparted to these members by sticking a gas barrier film, sealing with the gas barrier film, or the like.

As the gas barrier film for such applications, a transfer-type gas barrier film has been known.

As an example, the transfer-type gas barrier film has a configuration in which a peeling layer is formed on a surface of a substrate (separator), a gas barrier layer is formed on a surface of the peeling layer, and an adhesive layer is formed on a surface of the gas barrier layer.

Such a transfer-type gas barrier film is, for example, transferred (peeled and transferred) to a sticking target by sticking the adhesive layer to the sticking target such as an organic EL element and peeling off the substrate.

For example, JP2017-043060A describes a transfer-type gas barrier film including a substrate; a gas barrier layer which is provided on one surface of the substrate and has one or more sets of a combination of an inorganic layer and an organic layer as a base of the inorganic layer; and a peeling resin layer which is provided between the substrate and the gas barrier layer, firmly sticks to the organic layer, and is used for peeling from the substrate. In addition, in JP2017-043060A, a cycloolefin copolymer is exemplified as a preferred forming material of the peeling resin layer, and an ultraviolet-curable resin and an electron beam-curable resin with a high glass transition point (Tg) of 200° C. or higher are exemplified as a preferred base organic layer, respectively.

With such a configuration, an object of JP2017-043060A is to realize a transfer-type gas barrier film which can provide high gas barrier performance.

In addition, JP2017-043058A describes a method for producing a gas barrier film, in which the gas barrier film is a transfer-type gas barrier film including a peeling resin layer formed on a substrate; and a gas barrier layer formed on the peeling resin layer and having one or more sets of an organic layer and an inorganic layer, in which the substrate can be peeled off from the peeling resin layer, and the method includes a peeling layer forming step of forming a peeling resin layer having a peel force from the substrate of 0.04 to 1 N/25 mm on one main surface of the substrate; an organic layer forming step of forming an organic layer on the peeling resin layer; and an inorganic layer forming step of forming an inorganic layer on the organic layer.

JP2017-043058A describes that, in a case where the peeling resin layer on the substrate is easily peeled off from the substrate, the gas barrier film cannot be produced in the first place, and in a case where adhesiveness is too high, an inorganic film will be broken by shearing stress in a case of peeling. On the other hand, with such a configuration, an object of JP2017-043058A is to produce a transfer-type gas barrier film which optimizes an adhesive force between a support and the peeling resin layer and can be peeled without breaking a barrier layer.

SUMMARY OF THE INVENTION

According to these transfer-type gas barrier films, it is possible to transfer a gas barrier film with high gas barrier performance to optical elements such as a solar cell, and it is possible to prevent the optical element from being deteriorated by moisture or the like to some extent.

However, in recent years, the gas barrier performance required for the transfer-type gas barrier film has been progressively increased, and it has been desired to develop a transfer-type gas barrier film exhibiting more excellent gas barrier performance.

For the purpose of solving such a problem, an object of the present invention is to provide a transfer-type gas barrier film exhibiting excellent gas barrier performance, an optical element formed of the gas barrier film, and a method for producing the gas barrier film.

The object of the present invention is achieved by the following configurations.

[1] A gas barrier film comprising:
   a substrate;
   a peeling resin layer which is provided on one surface of the substrate and from which the substrate can be peeled off;
   at least one inorganic layer; and
   an adhesive layer provided on a surface of a layer of the at least one inorganic layer, the layer being most spaced from the substrate and the surface being opposite to a side of the substrate,
   in which a layer of the at least one inorganic layer, which is nearest to the substrate is provided on a surface of the peeling resin layer, which is opposite to a side of the substrate,
   the peeling resin layer is a resin layer having an aromatic ring, and
   the adhesive layer is solid at normal temperature and has fluidity by heating, thereby exhibiting adhesiveness.

[2] The gas barrier film according to [1],
   in which the adhesive layer has fluidity at 50° C. to 200° C., thereby exhibiting adhesiveness.

[3] The gas barrier film according to [1] or [2],
   in which a glass transition point of the peeling resin layer is 180° C. or higher.

[4] The gas barrier film according to any one of [1] to [3],
   in which the peeling resin layer includes a bisphenol structure.

[5] The gas barrier film according to any one of [1] to [4], in which the peeling resin layer includes a polyarylate.
[6] The gas barrier film according to any one of [1] to [5], in which a thickness of the peeling resin layer is 0.2 to 4 μm.
[7] The gas barrier film according to any one of [1] to [6], in which a glass transition point of the adhesive layer is 130° C. or lower.
[8] The gas barrier film according to any one of [1] to [7], in which a thickness of the adhesive layer is 1 to 30 μm.
[9] The gas barrier film according to any one of [1] to [8], in which the adhesive layer is a resin layer having an amorphous resin as a main component.
[10] The gas barrier film according to [9], in which the adhesive layer is a resin layer having an acrylic resin as a main component.
[11] The gas barrier film according to [10], in which the acrylic resin is a resin obtained by polymerizing a single acrylate monomer.
[12] The gas barrier film according to any one of [9] to [11], in which the adhesive layer includes one or more of a styrene-acrylic copolymer, a urethane-acrylic copolymer, and an acrylic resin for adjusting a glass transition point.
[13] The gas barrier film according to [10] or [11], in which the adhesive layer is a layer consisting of a resin obtained by polymerizing a single acrylate monomer.
[14] The gas barrier film according to any one of [1] to [13], in which the substrate is peeled off from the peeling resin layer.
[15] The gas barrier film according to any one of [1] to [14], further comprising:
at least one set of a combination of an inorganic layer and an organic layer between the inorganic layer formed on the surface of the peeling resin layer and the adhesive layer, the inorganic layer being different from the inorganic layer formed on the surface of the peeling resin layer and the organic layer being a base of the inorganic layer different from the inorganic layer formed on the surface of the peeling resin layer.
[16] An optical element,
in which the gas barrier film according to any one of claims 1 to 15 is stuck to a surface of an optical element body.
[17] The optical element according to [16],
in which the optical element body is an organic electroluminescence element.
[18] A method for producing a gas barrier film, the method comprising:
a step of forming a peeling resin layer capable of peeling off a substrate by applying a composition obtained by dissolving a resin having an aromatic ring in a solvent onto a surface of the substrate, and drying the composition;
a step of forming at least one inorganic layer according to a vapor deposition method, the step including a formation of the at least one inorganic layer on a surface of the peeling resin layer; and
a step of forming an adhesive layer by applying a composition obtained by dissolving, in a solvent, a resin which is solid at normal temperature and has fluidity by heating, thereby exhibiting adhesiveness, onto a surface of the inorganic layer most spaced from the substrate, and drying the composition.

[19] The method for producing a gas barrier film according to [18],
in which the vapor deposition method is plasma CVD.

According to the present invention, it is possible to provide a transfer-type gas barrier film exhibiting excellent gas barrier performance, an optical element formed of the gas barrier film and having high durability, and a producing method capable of suitably producing the gas barrier film.

BRIEF DESCRIPTION OF THE DRAWINGS

FIG. 5 is a view conceptually showing an example of the optical element of the present invention.

DESCRIPTION OF THE PREFERRED EMBODIMENTS

Figure 1:
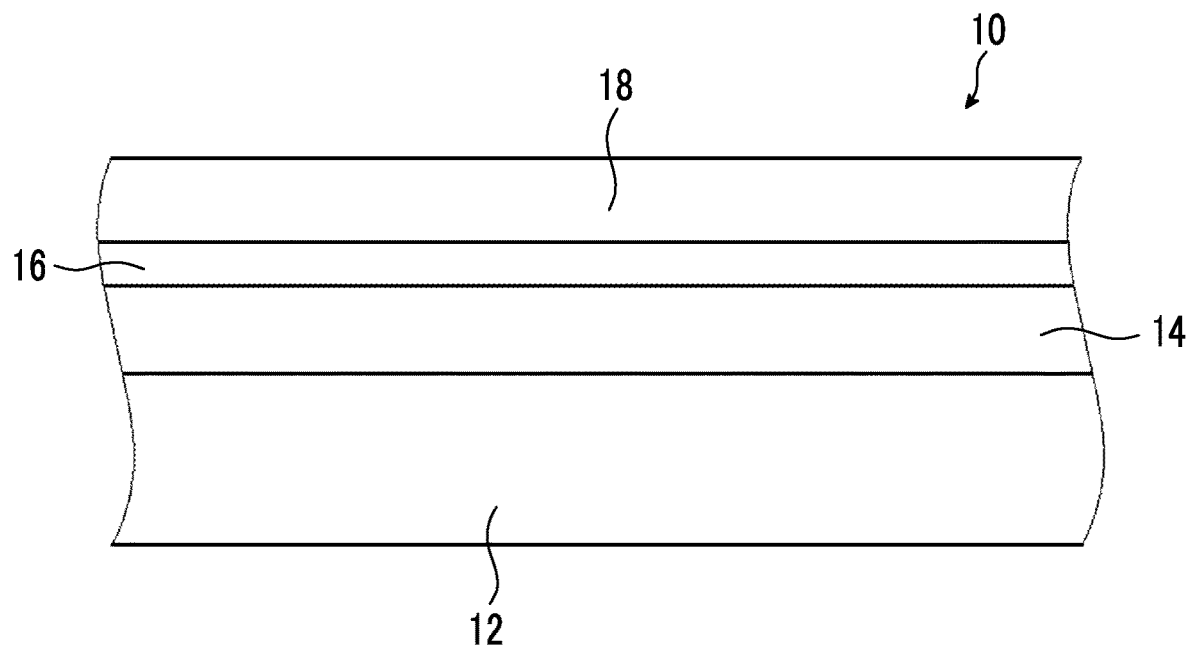
FIG. 1 is a view conceptually showing an example of the gas barrier film of the present invention.

Hereinafter, the gas barrier film, optical element, and method for producing a gas barrier film according to embodiments of the present invention will be described with reference to the drawings.
(Gas Barrier Film)
FIG. 1 conceptually shows an example of the gas barrier film according to the embodiment of the present invention.
FIG. 1 is a conceptual view of the gas barrier film according to the embodiment of the present invention viewed from a surface direction of the main surface. The main surface is the largest surface of a sheet-like material (film and plate-like material).
A gas barrier film 10 shown in FIG. 1 is composed of a substrate 12, a peeling resin layer 14, an inorganic layer 16, and an adhesive layer 18.
The gas barrier film 10 is the above-described transfer-type (peel and transfer-type) gas barrier film. As will be described later in detail, the peeling resin layer 14 is a layer sticking to the substrate 12 and capable of peeling off the substrate 12, and is a resin layer having an aromatic ring. In addition, the adhesive layer 18 is a resin layer which is solid at normal temperature and has fluidity by heating.
In the following description, in the gas barrier film 10, a side of the substrate 12 is also referred to as "bottom", and a side of the adhesive layer 18 is also referred to as "top".
<Substrate (Separator)>
As the substrate 12, a known sheet-like material (film and plate-like material) which is used as a substrate (support) in various gas barrier films, various laminated functional films, and the like can be used.
In addition, as the substrate 12, various sheet-like materials which are used as a separator (light-peeling separator and heavy-peeling separator) in various optical clear adhesives (OCA) can be also used.
A material of the substrate 12 is not limited, and various materials can be used as long as the peeling resin layer 14, the inorganic layer 16, and the adhesive layer 18 can be formed and the material is not dissolved in a solvent included in a composition for forming the peeling resin layer 14. As the material of the substrate 12, various resin materials are preferably exemplified.

Examples of the material of the substrate 12 include polyethylene (PE), polyethylene naphthalate (PEN), polyamide (PA), polyethylene terephthalate (PET), polyvinyl chloride (PVC), polyvinyl alcohol (PVA), polyacrylonitrile (PAN), polyimide (PI), transparent polyimide, poly(methyl methacrylate) resin (PMMA), polycarbonate (PC), polyacrylate, polymethacrylate, polypropylene (PP), polystyrene (PS), acrylonitrile-butadiene-styrene copolymer (ABS), cycloolefin copolymer (COC), cycloolefin polymer (COP), triacetyl cellulose (TAC), and ethylene-vinyl alcohol copolymer (EVOH).

The thickness of the substrate 12 can be appropriately set depending on the application, the material, and the like.

The thickness of the substrate 12 is not limited, but from the viewpoint that the mechanical strength of the gas barrier film 10 can be sufficiently secured, a gas barrier film having good flexibility can be obtained, the weight and thickness of the gas barrier film 10 can be reduced, and the like, is preferably 5 to 150 μm and more preferably 10 to 100

<Peeling Resin Layer>

The gas barrier film has a peeling resin layer which is provided on one surface of the substrate and from which the substrate can be peeled off. In the gas barrier film 10 according to the embodiment, the peeling resin layer 14 is formed on one surface of the substrate 12.

The peeling resin layer 14 is a resin layer which sticks to the substrate 12 and from which the substrate 12 can be peeled off. That is, the peeling resin layer 14 is a resin layer capable of being peeled off from the substrate 12. Therefore, in the gas barrier film 10, an adhesive force between the peeling resin layer 14 and the inorganic layer 16 is stronger than an adhesive force between the substrate 12 and the peeling resin layer 14. Since the peeling resin layer 14 has an aromatic ring, the substrate 12 can be peeled off.

As will be described later, the inorganic layer 16 formed on a surface of the peeling resin layer 14 is preferably formed according to plasma chemical vapor deposition (CVD). Therefore, in a case of forming the inorganic layer 16, the peeling resin layer 14 is etched by plasma, and a layer, as a mixed layer, having components of the peeling resin layer 14 and components of the inorganic layer 16 is formed between the peeling resin layer 14 and the inorganic layer 16. As a result, the peeling resin layer 14 and the inorganic layer 16 are firmly stuck with a very strong adhesive force.

Therefore, in the gas barrier film 10, the adhesive force between the peeling resin layer 14 and the inorganic layer 16 is much stronger than the adhesive force between the substrate 12 and the peeling resin layer 14, and the peeling resin layer 14 is not peeled off from the inorganic layer 16 even in a case where the substrate 12 is peeled off from the peeling resin layer 14.

In addition, the peeling resin layer 14 is a base layer for forming the inorganic layer 16 properly.

That is, the peeling resin layer 14 formed on the surface of the substrate 12 embeds irregularities on the surface of the substrate 12, foreign matters attached to the surface, and the like. As a result, it is possible to properly form the inorganic layer 16 with a proper surface of forming the inorganic layer 16.

In the gas barrier film 10, by forming the inorganic layer 16 on the peeling resin layer 14 capable of peeling off the substrate 12, a gas barrier film from which the substrate 12 can be peeled off and which has excellent gas barrier performance is realized. This will be described in detail later.

Furthermore, the peeling resin layer 14 acts as a protective layer which protects the inorganic layer 16 after peeling off the substrate 12.

As described above, in the gas barrier film 10, by forming the peeling resin layer 14 with a resin having an aromatic ring, the substrate 12 can be peeled off.

The peeling resin layer 14 preferably has a resin including a bisphenol structure as a main component. The peeling resin layer 14 more preferably has a polyarylate (polyarylate resin (PAR)) as a main component. As well known in the art, the polyarylate is an aromatic polyester consisting of polycondensates of a dihydric phenol such as bisphenol represented by bisphenol A and a dibasic acid such as phthalic acid (terephthalic acid and isophthalic acid).

From the viewpoint that it is possible to obtain a gas barrier film 10 in which the adhesive force between the substrate 12 and the peeling resin layer 14 is proper and the substrate 12 can be easily peeled off; since the peeling resin layer 14 has proper flexibility, it is possible to prevent damage (flaws, cracks, and the like) of the inorganic layer 16 in a case of peeling off the substrate 12; since the peeling resin layer 14 has high heat resistance, it is possible to stably form a proper inorganic layer 16; it is possible to prevent the deterioration of performance after transfer; and the like, the aspect in which the peeling resin layer 14 has a resin including a bisphenol structure as a main component, particularly the peeling resin layer 14 has the polyarylate as a main component, is preferable.

The main component refers to a component having the largest content mass ratio among the contained components.

In the gas barrier film 10, the peeling resin layer 14 preferably has high heat resistance. Specifically, in the peeling resin layer 14, the glass transition point (Tg) is preferably 175° C. or higher, preferably 185° C. or higher, more preferably 200° C. or higher, and still more preferably 250° C. or higher.

As described above, the inorganic layer 16 formed on a surface of the peeling resin layer 14 is preferably formed according to plasma CVD. The aspect in which Tg of the peeling resin layer 14 is 175° C. or higher is preferable from the viewpoint that, in a case of forming the inorganic layer 16, etching and volatilization of the peeling resin layer 14 due to plasma can be suitably suppressed, the proper peeling resin layer 14 and inorganic layer 16 can be suitably formed, and the like.

The upper limit of Tg of the peeling resin layer 14 is not limited, but is preferably 500° C. or lower.

In addition, for the same reason as Tg, a resin forming the peeling resin layer 14 preferably has a large molecular weight to some extent.

Specifically, in the resin forming the peeling resin layer 14, the molecular weight (weight-average molecular weight (Mw)) is preferably 500 or more, more preferably 1000 or more, and still more preferably 1500 or more.

It is sufficient that Tg of the peeling resin layer 14 is specified by a known method using a differential scanning calorimeter (DSC) or the like. In addition, it is also sufficient that the molecular weight is measured by a known method using gel permeation chromatography (GPC) or the like. In addition, in a case of using a commercially available product, it is sufficient that catalog values are used as Tg of the peeling resin layer 14 and the molecular weight.

With regard to the above points, the same applies to the adhesive layer 18 described later.

As described above, in the gas barrier film according to the embodiment of the present invention, the peeling resin layer 14 can be formed of various resins having an aromatic ring. In addition, the peeling resin layer 14 may be formed of a commercially available product as long as the commercially available product is a resin having an aromatic ring.

Examples of the commercially available resin which can be used to form the peeling resin layer 14 include UNIFINER and U-POLYMER manufactured by UNITIKA LTD., and Neopulim manufactured by MITSUBISHI GAS CHEMICAL COMPANY, INC.

The thickness of the peeling resin layer 14 is not limited, but is preferably 0.2 to 6 more preferably 0.5 to 5 and still more preferably 1 to 3 μm.

The aspect in which the thickness of the peeling resin layer 14 is 0.2 μm or more is preferable from the viewpoint that it is possible to stably form a proper inorganic layer 16, it is possible to maintain mechanical strength in which the peeling resin layer 14 is not torn in a case of peeling and to favorably peel off, the peeling resin layer 14 is not affected by foreign matters of the separator or the like, and the like. In addition, the aspect in which the thickness of the peeling resin layer 14 is 6 μm or less is preferable from the viewpoint that the weight and thickness of the gas barrier film 10 can be reduced, a highly transparent gas barrier film can be obtained, good peelability of the substrate 12 can be obtained, the peeling resin layer 14 can be uniformly cured in a case of heat curing, the content of a residual solvent can be suppressed, and the like.

The thickness of the peeling resin layer 14 refers to a thickness of a layer consisting of only forming components of the peeling resin layer 14, not including the above-mentioned mixed layer.

The peeling resin layer 14 can be formed by a known method depending on the material.

For example, the peeling resin layer 14 can be formed, according to a coating method, by preparing a composition (resin composition) in which the resin forming the peeling resin layer 14, and the like are dissolved in a solvent, applying the composition onto the substrate 12, and drying the composition. In the formation of the peeling resin layer 14 according to the coating method, the dried composition may be further irradiated with ultraviolet rays to polymerize (crosslink) the resin (organic compound) in the composition as necessary.

The peeling resin layer 14 is preferably formed by roll-to-roll. In the following description, "roll-to-roll" is also referred to as "RtoR".

As well known in the art, RtoR is a producing method of sending out a sheet-like material from a roll formed by winding a long sheet-like material, performing film formation while transporting the long sheet in a longitudinal direction, and winding the film-formed sheet-like material into a roll. By using RtoR, high productivity and production efficiency can be obtained.

<Inorganic Layer>

The inorganic layer 16 is a thin film including an inorganic compound, and is formed on at least the surface of the peeling resin layer 14. As will be described later, the gas barrier film according to the embodiment of the present invention may have one or more sets of a combination of an organic layer which is a base of the inorganic layer 16 and the inorganic layer 16 between the inorganic layer 16 formed on the surface of the peeling resin layer 14 and the adhesive layer 18.

In the gas barrier film 10, the inorganic layer 16 mainly exhibits gas barrier performance.

The surface of the substrate 12 has a region where the inorganic compound is difficult to deposit to form a film, such as irregularities and shadows of foreign matters. As described above, by providing the peeling resin layer 14 on the surface of the substrate 12 and forming the inorganic layer 16 thereon, the region where the inorganic compound is difficult to deposit to form a film is covered. Therefore, it is possible to the inorganic layer 16 on the surface of forming the inorganic layer 16 without any gap.

A material of the inorganic layer 16 is not limited, and various inorganic compounds used in a known gas barrier layer consisting of an inorganic compound exhibiting gas barrier performance can be used.

Examples of the material of the inorganic layer 16 include inorganic compounds of metal oxides such as aluminum oxide, magnesium oxide, tantalum oxide, zirconium oxide, titanium oxide, and indium tin oxide (ITO); metal nitrides such as aluminum nitride; metal carbides such as aluminum carbide; silicon oxides such as silicon oxide, silicon oxynitride, silicon oxycarbide, and silicon oxynitride carbide; silicon nitrides such as silicon nitride and silicon nitride carbide; silicon carbides such as silicon carbide; hydrides of these compounds; mixtures of two or more of these compounds; and hydrogen-containing substances of these compounds. In addition, a mixture of two or more of the above-described inorganic compounds can be used.

Among these, silicon nitride, silicon oxide, silicon oxynitride, aluminum oxide, or a mixture of two or more of these compounds is suitably used from the viewpoint that the inorganic layer 16 has high transparency and exhibits excellent gas barrier performance. Among these, a compound containing silicon is suitably used, and particularly, silicon nitride is suitability used from the viewpoint that the inorganic layer 16 exhibits excellent gas barrier performance.

The thickness of the inorganic layer 16 is not limited, and can be appropriately set to a thickness capable of exhibiting a desired gas barrier performance depending on the material.

The thickness of the inorganic layer 16 is preferably 2 to 150 nm, more preferably 5 to 50 nm, and still more preferably 10 to 30 nm.

The aspect in which the thickness of the inorganic layer 16 is 2 nm or more is preferable from the viewpoint that an inorganic layer 16 which stably exhibits sufficient gas barrier performance can be formed. In addition, the inorganic layer 16 is generally brittle, and in a case where the inorganic layer 16 is too thick, flaws, cracks, peeling, or the like may occur. However, in a case where the thickness of the inorganic layer 16 is 150 nm or less, it is possible to prevent flaws from occurring.

As will be described later, in a case where a plurality of inorganic layers 16 is provided, the thickness of each inorganic layer 16 may be the same as or different from each other.

In addition, in a case where a plurality of inorganic layers 16 is provided, the material of each inorganic layer 16 may be the same as or different from each other.

The inorganic layer 16 can be formed by a known method depending on the material.

Suitable examples of the method include various vapor deposition methods such as plasma CVD, for example, capacitively coupled plasma (CCP)-CVD, inductively coupled plasma (ICP)-CVD, and the like; atomic layer deposition (ALD); sputtering, for example, magnetron sputtering, reactive sputtering, and the like; and vacuum vapor deposition.

Among these, as described above, plasma CVD such as CCP-CVD and ICP-CVD is suitably used from the viewpoint that the adhesive force between the peeling resin layer 14 and the inorganic layer 16 can be improved.

The inorganic layer 16 is also preferably formed by RtoR.

The gas barrier film has an adhesive layer provided on a surface of a layer of the at least one inorganic layer, the layer being most spaced from the substrate and the surface being opposite to a side of the substrate. In the gas barrier film 10 according to the embodiment, the adhesive layer 18 is formed on the uppermost layer, that is, on the surface opposite to the substrate 12. In other words, the adhesive layer 18 is formed on a surface of the inorganic layer 16 most spaced from the substrate 12. Since the gas barrier film 10 in the drawing has only one inorganic layer 16, the adhesive layer 18 is formed on a surface of the inorganic layer 16 formed on the surface of the peeling resin layer 14. In a case where the gas barrier film has only one inorganic layer, the inorganic layer is an inorganic layer most spaced from the substrate.

The adhesive layer 18 is a layer as an adhesive in a case of sticking the gas barrier film 10 to a sticking target such as an organic EL element. In addition, the adhesive layer 18 also acts as a protective layer which protects the inorganic layer 16 exhibiting gas barrier performance.

In the gas barrier film 10, the adhesive layer 18 is an adhesive layer formed of a hot melting adhesive (HMA), instead of an optical clear adhesive (OCA) which is used in a transfer-type gas barrier film in the related art. Specifically, the adhesive layer 18 is an adhesive layer which is solid at normal temperature, and has fluidity by heating, thereby exhibiting adhesiveness remaining 80 squares or more in a peeling test according to the cross-cut method specified in JIS K 5600-5-6 (1999). The normal temperature refers to, for example, any temperature in a range of 20° C.±15° C. The adhesive layer 18 is preferably solid at any temperature in a range of 20° C.±15° C., and more preferably solid at 23° C.

In the present invention, by forming the inorganic layer 16 on the peeling resin layer 14 sticking to the substrate 12 and capable of peeling off the substrate 12, and using a hot melting adhesive instead of OCA as the adhesive layer 18, a gas barrier film with higher gas barrier performance than the transfer-type gas barrier film in the related art is realized.

As the gas barrier film with high gas barrier performance, a gas barrier film having an organic and inorganic laminated structure which is a laminated structure of an organic layer and an inorganic layer has been known. The organic/inorganic lamination-type gas barrier film has a configuration in which one or more sets of a combination of an inorganic layer mainly exhibiting gas barrier performance and a (base) organic layer which is a base layer of the inorganic layer are formed on a surface of a substrate.

As described in JP2017-043060A, in the transfer-type gas barrier film having an organic and inorganic laminated structure, a peeling resin layer consisting of COC and the like is provided on the surface of the substrate, one or more sets of a combination of an organic layer and an inorganic layer are formed on the surface of the peeling resin layer, and an adhesive layer for sticking to a sticking target is provided on the surface of the uppermost inorganic layer by OCA or the like.

The transfer-type gas barrier film is stuck to a sticking target by the adhesive layer, and transferred (peeled and transferred) to the sticking target by peeling off the substrate from the peeling resin layer.

In the transfer-type gas barrier film having an organic and inorganic laminated structure, the peeling resin layer and the organic layer are formed according to the coating method. As well known in the art, in the formation of a resin layer according to the coating method, a composition is prepared by dissolving a monomer, resin, or the like forming the resin layer in a solvent, and the resin layer is formed by applying and drying the composition, or as necessary, by further crosslinking the monomer, resin, or the like by irradiation with ultraviolet rays or the like.

However, in a case where the organic layer is formed on the surface of the peeling resin layer according to the coating method, a solvent included in a composition for forming an organic layer dissolves the peeling resin layer, and the components of the peeling resin layer are mixed in the organic layer. As a result, impurities are mixed in the organic layer, and it is difficult to obtain a pure cured product desired for the original organic layer.

In addition, as described above, the inorganic layer is preferably formed according to plasma CVD. Therefore, in the organic layer which is a base of the inorganic layer, a polyfunctional acrylic resin having a high crosslinking property, high Tg, and high hardness is suitably used to prevent etching due to plasma. On the other hand, since COC or the like forming the peeling resin layer has lower Tg and hardness than the organic layer, COC or the like is easily etched and volatilized by plasma in a case of forming the inorganic layer. Moreover, since the components of the peeling resin layer are mixed into the composition for forming an organic layer before the composition is cured, the components of the peeling resin layer reach the vicinity of the surface of the organic layer.

Therefore, in a case of forming the inorganic layer, the components of the peeling resin layer are severely etched and volatilized so as to hinder the deposition of the inorganic layer to form a film, which causes the formation of defects (pores) impairing gas barrier performance in the inorganic layer.

Furthermore, since an organic layer having a very high crosslinking property is formed, stress is generated on the peeling resin layer and curling easily occurs. In addition, necessarily, the force of peeling the organic layer also propagates between the peeling resin layer and the substrate due to the curling, and self-peeling between the substrate and the peeling resin layer may occur in a case where the adhesive force is low. In a case where the adhesive force between the peeling resin layer and the substrate is designed to be high in order to prevent the self-peeling, the inorganic layer is likely to be damaged in a case of peeling off the substrate. That is, in the gas barrier layer having an organic and inorganic laminated structure, the organic layer which is a base of the inorganic layer is an important factor for enhancing gas barrier performance, but may be disadvantageous in the transfer-type gas barrier film.

In addition, in the transfer-type gas barrier film in the related art, particularly in the transfer-type gas barrier film used for the optical element such as an organic EL element, optical properties such as high transparency are required. Therefore, as described above, OCA is used for an adhesive layer which is provided on the uppermost layer to stick to the sticking target in a case of transfer.

However, since an adhesive such as OCA has adhesiveness, it is necessary to stick a separator on the surface in order to ensure handleability. In addition, since OCA or the like has adhesiveness, OCA or the like is well stretched in a case of pulling. Therefore, OCA also pulls outside of a portion other than the portion to be stuck in a case of peeling off the separator and peeling off the substrate during the transfer of gas barrier film. As a result, the inorganic layer is also pulled by OCA, which causes damage to the inorganic layer, particularly in the vicinity of the edge of the inorganic layer, and deteriorates gas barrier performance.

In addition, the transfer-type gas barrier film is usually cut into a desired size and shape in a case of use. OCA is also pulled at the edge in a case of the cutting, and in the edge, the area outside of the desired size and shape is jagged, which is a phenomenon similar to the so-called "foiling" phenomenon in general transfer technology. The foiling also occurs, in a case of transfer, in the above-described peeling off the separator from the adhesive layer and peeling off the substrate from the gas barrier film. In a case where the foiling occurs, in the edge of the gas barrier film, the foiling causes damage to the inorganic layer, and the like, and deteriorates gas barrier performance. Furthermore, the foiled gas barrier film is disadvantageous in product quality, and in a case where the gas barrier film is transferred to the sticking target, the gas barrier film may cover an unnecessary portion such as a display portion of a display device. Furthermore, a weakly stuck portion is generated due to the foiling, which also causes physical breaking from the portion and an increase in a failure portion.

In order to solve such problems, the present inventor has conducted intensive studies. As a result, the present inventor has considered that it is important to realizing an adhering method of forming a peeling resin layer capable of forming an inorganic layer properly and directly forming an inorganic film thereon, and which is capable of peeling off a substrate without breaking the formed inorganic layer.

Specifically, a resin having Tg capable of forming an inorganic layer according to plasma CVD is dissolved in a solvent to form a composition (varnish), the composition is applied to the substrate and cured by heating and drying to form the peeling resin layer 14, and the inorganic layer 16 is directly formed on the peeling resin layer 14. Furthermore, the adhesive layer 18 is formed of a hot melting adhesive which is solid and acts as a protective layer for the inorganic layer 16 at normal temperature, and functions an adhesive in a case of sticking to the sticking target.

By preparing a composition forming the peeling resin layer 14 with high heat resistance and applying the composition in solution, the function of supporting the inorganic layer 16 and foreign matter embedding property on the substrate to enhance gas barrier performance can be achieved. In addition, since the hot melting adhesive is usually solid, the adhesive layer 18 acts as a protective layer of the inorganic layer 16, and in a case of sticking, exhibits adhesiveness and fluidity only in the heated portion. Therefore, it is possible to be cut into any shape and size and transferred without the foiling. In addition, by forming the adhesive layer 18 with a hot melting adhesive and controlling the adhesive force to the sticking target with the uppermost layer (outermost layer) of the gas barrier film 10, a force of positively and firmly sticking to the sticking target is generated, and as a result, the substrate 12 can be stably peeled off. That is, by forming the adhesive layer 18 with a hot melting adhesive, the restriction of the adhesive force applied between the peeling resin layer 14 and the substrate 12 is extremely low, and it is possible to neatly transfer only the heated portion.

As a result, in the gas barrier film 10, the foiling and damage (flaws, cracks, and the like) of the inorganic layer 16, which occur in the transfer-type gas barrier film in a case of cutting the gas barrier film 10, transfer, that is, sticking to the sticking target, and peeling of the substrate 12 in the transfer-type gas barrier film, can be prevented, and high gas barrier performance can be exhibited for a long time with excellent durability.

As described above, in the gas barrier film 10, the adhesive layer 18 is formed of the hot melting adhesive, is solid at normal temperature, and has fluidity by heating, thereby exhibiting adhesiveness.

The adhesive layer 18 has fluidity preferably at 30° C. to 200° C., more preferably at 40° C. to 180° C., and still more preferably at 50° C. to 150° C., thereby exhibiting adhesiveness.

In a case where the adhesive layer 18 has fluidity at normal temperature, thereby exhibiting adhesiveness, the above-described foiling easily occurs in a case of cutting and transferring the gas barrier film 10, and gas barrier performance is deteriorated.

In addition, in a case where the temperature at which the adhesive layer 18 has fluidity, thereby exhibiting adhesiveness, is too high, the heating temperature required for sticking to the sticking target is high, which causes heat damage to the substrate 12, the peeling resin layer 14, and the sticking target.

In the gas barrier film 10, Tg of the adhesive layer 18 is not limited, but is preferably 130° C. or lower, more preferably 100° C. or lower, still more preferably 60° C. or lower, and particularly preferably 30° C. or lower.

The aspect in which Tg of the adhesive layer 18 is 130° C. or lower is preferable from the viewpoint that, since heat fluidity is easily obtained, it is possible to improve adhesiveness and transferability by heating so as to prevent the above-described foiling, it is possible to perform adhesion at low temperature and improve productivity, and the like.

The lower limit of Tg of the adhesive layer 18 is not limited, but is preferably −150° C. or higher.

A material of the adhesive layer 18 is not limited as long as the material is solid at normal temperature and has fluidity by heating, thereby exhibiting adhesiveness.

The adhesive layer 18 preferably has an amorphous resin as a main component, more preferably has an acrylic resin as a main component, and still more preferably has a resin (acrylic homopolymer (homoacrylic polymer)) obtained by polymerizing a single acrylate monomer as a main component.

The aspect in which the main component of the adhesive layer 18 is an amorphous resin, particularly acrylic resin, is preferable from the viewpoint that it is possible to obtain a gas barrier film 10 having high transparency, and the like.

Furthermore, the aspect in which the main component of the adhesive layer 18 is an acrylic homopolymer is preferable from the viewpoint that, in addition to the advantage described above, it is possible to improve transferability by heat and prevent the foiling, it is difficult to block in a case of winding after curing, and the like. In addition, by forming the adhesive layer 18 with an acrylic homopolymer, in addition to the advantages described above, the adhesive layer 18 can be a layer which has fluidity at a relatively low temperature, thereby exhibiting adhesiveness. Therefore, in a case where high heat resistance is not required for the gas barrier film 10, the adhesive layer 18 consisting of the acrylic homopolymer is suitably used.

These resins are not limited, and various known resins and commercially available products can be used as long as the resin can form an adhesive layer 18 which is solid at normal temperature and has fluidity by heating, thereby exhibiting adhesiveness.

Specific examples thereof include 0415BA (acrylic homopolymer) and #7000 series manufactured by Taisei Fine Chemical Co., Ltd.

The adhesive layer 18 may include one or more compounds selected from the group consisting of a styrene-acrylic copolymer (styrene-modified acrylic resin), a urethane-acrylic copolymer (urethane-modified acrylic resin), and an acrylic resin for adjusting a glass transition point as necessary.

By adding these components to the adhesive layer 18, Tg of the adhesive layer 18 can be improved. Therefore, in a case where heat resistance is required for the gas barrier film 10 depending on the application or the like, the adhesive layer 18 to which these components are added are suitably exemplified.

In addition, since the hardness of the adhesive layer 18 can be adjusted by adding the styrene-acrylic copolymer to the adhesive layer 18, it is possible to adjust the balance of hardness with the sticking target. By adding the urethane-acrylic copolymer to the adhesive layer 18, adhesiveness with the inorganic layer 16 can be improved.

The amount of these components to be added is not limited, and it is sufficient that the amount of these components to be added is appropriately adjusted depending on the components to be added and the target Tg. However, it is preferable that the amount of these components to be added is such that the main component of the adhesive layer 18 is the above-described amorphous resin or acrylic resin.

The styrene-acrylic copolymer, the urethane-acrylic copolymer, and the acrylic resin for adjusting a glass transition point are not limited, and various resins used for adjusting Tg of a resin or the like can be used. In addition, as these components, a commercially available product can be used.

Examples of the styrene-acrylic copolymer include #7000 series manufactured by Taisei Fine Chemical Co., Ltd.

Examples of the urethane-acrylic copolymer include Acrit 8UA series manufactured by Taisei Fine Chemical Co., Ltd., such as Acrit 8UA-347H.

Examples of the acrylic resin for adjusting a glass transition point include PMMA (for example, DIANAL manufactured by Mitsubishi Chemical Corporation.).

The thickness of the adhesive layer 18 is not limited, and it is sufficient that the thickness at which sufficient adhesiveness and performance of protecting the inorganic layer 16 are obtained is appropriately set depending on the material of the adhesive layer 18, and the like. The thickness of the adhesive layer 18 is preferably 1 to 30 μm, more preferably 2 to 20 μm, and still more preferably 3 to 10 μm.

The aspect in which the thickness of the adhesive layer 18 is 1 μm or more is preferable from the viewpoint that it is possible to obtain sufficient adhesive force in a case of transfer, it is possible to prevent deterioration of gas barrier performance in a case of peeling off the substrate 12 (after transfer), and the like. The aspect in which the thickness of the adhesive layer 18 is 30 μm or less is preferable from the viewpoint that it is possible to prevent the foiling, obtain a gas barrier film 10 having high transparency, form a thin and light gas barrier film 10, and prevent dripping (overflow) and intrusion of water from the edges, and the like.

(Another Form of Gas Barrier Film)

The gas barrier film 10 shown in FIG. 1 has the adhesive layer 18 on the inorganic layer 16 formed on the surface of the peeling resin layer 14.

Figure 2:
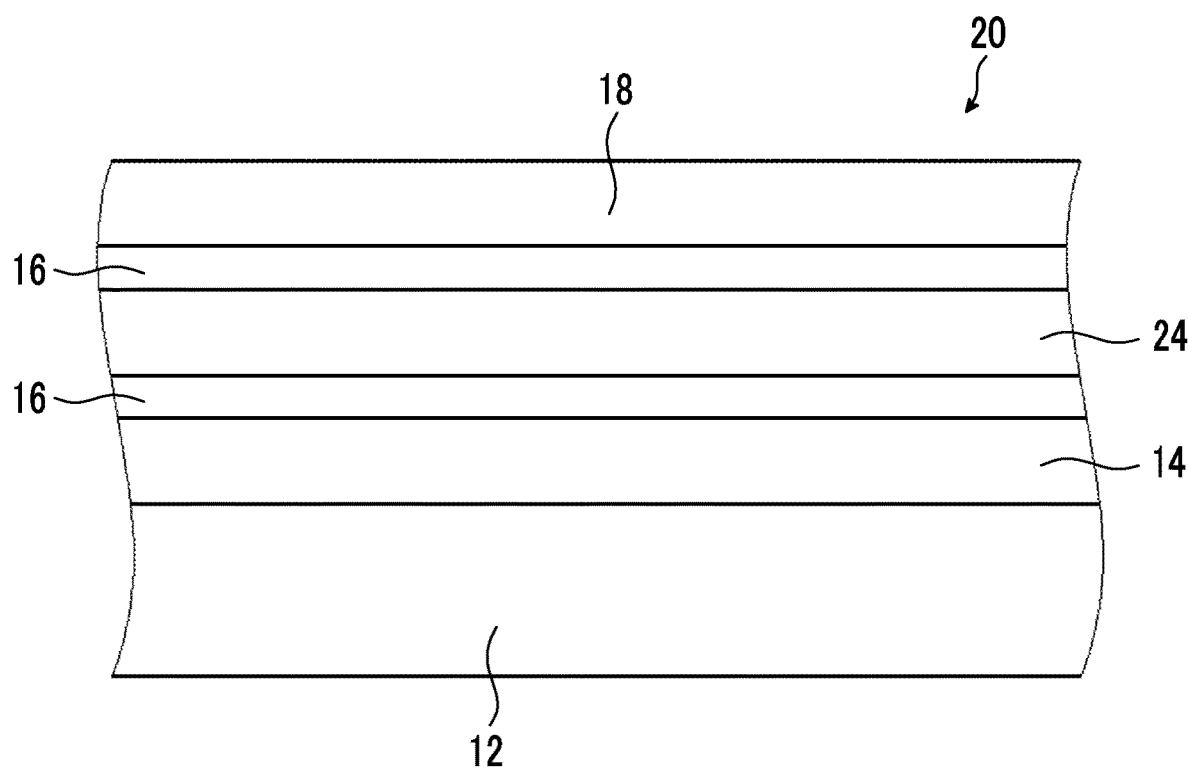
FIG. 2 is a view conceptually showing another example of the gas barrier film of the present invention.

The gas barrier film according to the embodiment of the present invention is not limited thereto, and as conceptually shown in FIG. 2 as a gas barrier film 20, may be a gas barrier film having the above-described organic and inorganic laminated structure, which has one or more sets of a combination of an inorganic layer 16 and a (base) organic layer 24 which is a base of the inorganic layer 16.

As described above, in the gas barrier film according to the embodiment of the present invention, the inorganic layer 16 mainly exhibits gas barrier performance.

Since a thin and proper inorganic layer can be formed by forming the inorganic layer 16 on the organic layer 24 which is a base, it is possible to obtain a gas barrier film having the organic and inorganic laminated structure with very excellent gas barrier performance.

The gas barrier film 20 shown in FIG. 2 has one set of a combination of the organic layer 24 and the inorganic layer 16, but the present invention is not limited thereto. That is, in a case of having the organic and inorganic laminated structure, the gas barrier film according to the embodiment of the present invention may have two sets of a combination of the organic layer 24 and the inorganic layer 16, or may have three or more sets of a combination of the organic layer 24 and the inorganic layer 16.

The aspect in which the gas barrier film according to the embodiment of the present invention has a number of combinations of the organic layer 24 and the inorganic layer 16 is basically advantageous from the viewpoint of gas barrier performance, but is disadvantageous from the viewpoint of the thickness, weight, transparency, and the like of the gas barrier film.

Therefore, in the gas barrier film according to the embodiment of the present invention, it is sufficient that whether or not the organic and inorganic laminated structure is used, and in a case of using the organic and inorganic laminated structure, the number of combinations of the organic layer 24 and the inorganic layer 16 is appropriately determined depending on the application of the gas barrier film, gas barrier performance, optical properties, and the like required for the gas barrier film, and the like.

<Organic Layer>

As described above, the organic layer 24 is a layer which is a base of the inorganic layer 16 and allows to properly form the inorganic layer 16 with a proper surface of forming the inorganic layer 16 in a case of forming the second and subsequent inorganic layers 16 in addition to the inorganic layer 16 formed on the surface of the peeling resin layer 14.

The organic layer 24 is, for example, a layer consisting of an organic compound obtained by polymerizing (crosslinking and curing) a monomer, a dimer, an oligomer, and the like.

The organic layer 24 is formed, for example, by curing a composition for forming an organic layer, which contains an organic compound (monomer, dimer, trimer, oligomer, polymer, and the like). The composition for forming an organic layer may include one kind of organic compound, or may include two or more kinds thereof.

The organic layer 24 contains, for example, a thermoplastic resin, an organosilicon compound, and the like. Examples of the thermoplastic resin include polyester, (meth)acrylic resin, methacrylic acid-maleic acid copolymer, polystyrene, transparent fluororesin, polyimide, fluorinated polyimide, polyamide, polyamideimide, polyetherimide, cellulose acylate, polyurethane, polyetheretherketone, polycarbonate, alicyclic polyolefin, polyarylate, polyethersulfone, polysulfone, fluorene ring-modified polycarbonate, alicyclic-modified polycarbonate, fluorene ring-modified polyester, and acrylic compound. Examples of the organosilicon compound include polysiloxane.

From the viewpoint of excellent strength and viewpoint of glass transition point, the organic layer 24 preferably includes a polymerization product of a radically curable compound and/or a cationic curable compound having an ether group.

From the viewpoint of lowering refractive index of the organic layer 24, the organic layer 24 preferably includes a (meth)acrylic resin having a polymer of a monomer, oligomer, and the like of (meth)acrylate as a main component.

By lowering the refractive index of the organic layer 24, transparency is increased and light-transmitting property is improved.

The organic layer 24 more preferably includes a (meth) acrylic resin having, as a main component, a polymer of a monomer, dimer, oligomer, and the like of bi- or more-functional (meth)acrylate, such as dipropylene glycol di(meth)acrylate (DPGDA), trimethylolpropane tri(meth)acrylate (TMPTA), and dipentaerythritol hexa(meth)acrylate (DPHA), and still more preferably include a (meth)acrylic resin having a polymer of a monomer, dimer, oligomer, and the like of tri- or more-functional (meth)acrylate as a main component. In addition, a plurality of these (meth)acrylic resins may be used. The main component refers to a component having the largest content mass ratio among the contained components.

The composition for forming an organic layer preferably includes an organic solvent, a surfactant, a silane coupling agent, and the like, in addition to the organic compound.

In a case where a plurality of organic layers 24 is provided, that is, a case where a plurality of sets of a combination of the organic layer 24 and the inorganic layer 16 is provided, the material of each organic layer 24 may be the same as or different from each other. With regard to this point, the same applies to the inorganic layer 16.

The thickness of the organic layer 24 is not limited, and can be appropriately set depending on the components included in the composition for forming an organic layer, the substrate 12 to be used, and the like.

The thickness of the organic layer 24 is preferably 0.1 to 5 µm and more preferably 0.2 to 3 µm. The aspect in which the thickness of the organic layer 24 is 0.1 µm or more is preferable from the viewpoint that the surface of the organic layer 24 can be flattened by embedding irregularities on the surface of the substrate 12, foreign matters attached to the surface, and the like. The aspect in which the thickness of the organic layer 24 is 5 µm or less is preferable from the viewpoint that cracks in the organic layer 24 can be prevented, flexibility of the gas barrier film 20 can be increased, the weight and thickness of the gas barrier film 20 can be reduced, and the like.

In a case where a plurality of organic layers 24 is provided, that is, a case where a plurality of sets of a combination of the inorganic layer 16 and the organic layer 24 is provided, the thickness of each organic layer 24 may be the same as or different from each other. With regard to this point, the same applies to the inorganic layer 16.

The organic layer 24 can be formed by a known method depending on the material.

For example, the organic layer 24 can be formed according to a coating method in which the above-described composition for forming an organic layer is applied and dried. In the formation of the organic layer 24 according to the coating method, the dried composition for forming an organic layer is further irradiated with ultraviolet rays to polymerize (crosslink) the organic compound in the composition as necessary.

In addition, the organic layer 24 is also preferably formed by RtoR.

(Usage Method of Gas Barrier Film)

The gas barrier film 10 (20) is cut into a predetermined size and shape as necessary, and the adhesive layer 18 is abutted to a sticking target such as an organic EL element and is heated to 50° C. by heating the gas barrier film 10 from the substrate 12 side.

By heating, the adhesive layer 18 has fluidity, thereby exhibiting adhesiveness, and the gas barrier film 10 is stuck to the sticking target.

Next, the adhesive layer 18 is cooled, and the substrate 12 is peeled off from the peeling resin layer 14 as necessary to transfer (peel and transfer) the gas barrier film. That is, the gas barrier film according to the embodiment of the present invention also includes a configuration in which the substrate 12 is peeled off from the peeling resin layer 14 as an aspect.

(Method for Producing Gas Barrier Film)

Hereinafter, an example of a method of producing the gas barrier film 10 will be described with reference to the conceptual views of FIGS. 3 and 4.

Figure 3:
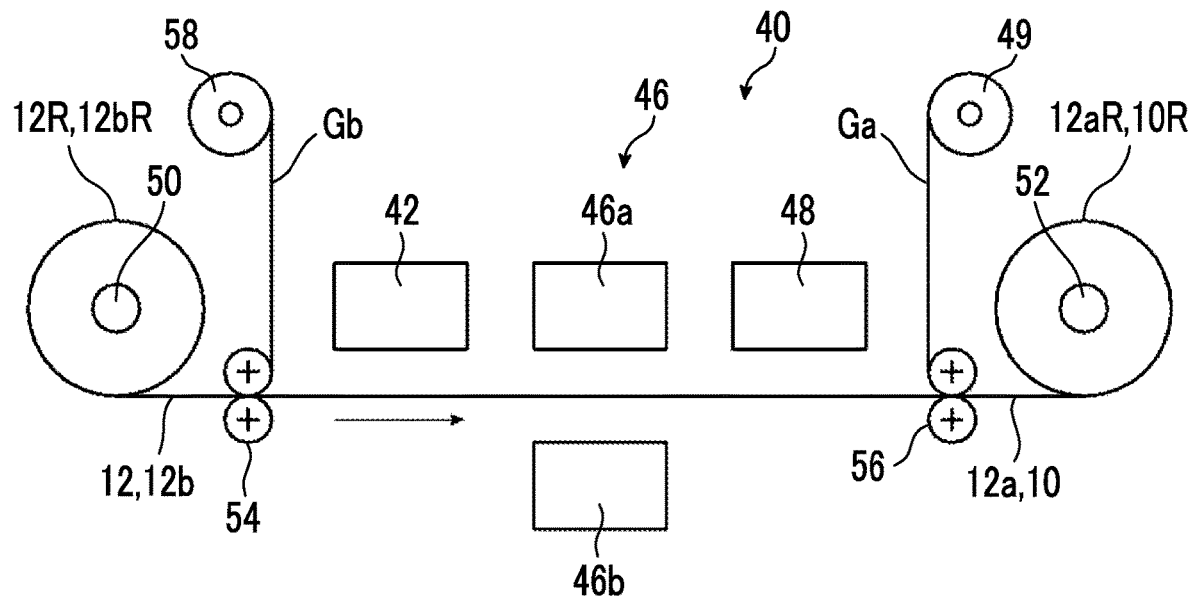
FIG. 3 is a view conceptually showing an example of an organic film forming apparatus for producing the gas barrier film of the present invention.

The apparatus shown in FIG. 3 is an organic film forming apparatus 40 which forms the peeling resin layer 14 and the adhesive layer 18, and as necessary, further forms the organic layer 24. The organic film forming apparatus 40 is an apparatus which forms the peeling resin layer 14 and the like by RtoR and which forms the peeling resin layer 14 and the adhesive layer 18 by applying a composition forming the peeling resin layer 14 and the like onto a long substrate 12 while transporting the long substrate 12 in a longitudinal direction, and by drying the composition. In addition, in a case of forming the organic layer 24, the organic layer 24 is formed by further irradiating the organic layer 24 with light to polymerize (cure) the organic compound included in the composition.

As an example, the organic film forming apparatus 40 in the drawing has a coating section 42, a drying section 46, a light irradiation section 48, a rotating shaft 50, a winding shaft 52, and transport roller pairs 54 and 56.

The light irradiation section 48 is usually used in a case of forming the organic layer 24. However, the present invention is not limited thereto, the polymerization of organic compound by light irradiation may also be performed in a case of forming the peeling resin layer 14 and/or the adhesive layer 18.

Figure 4:
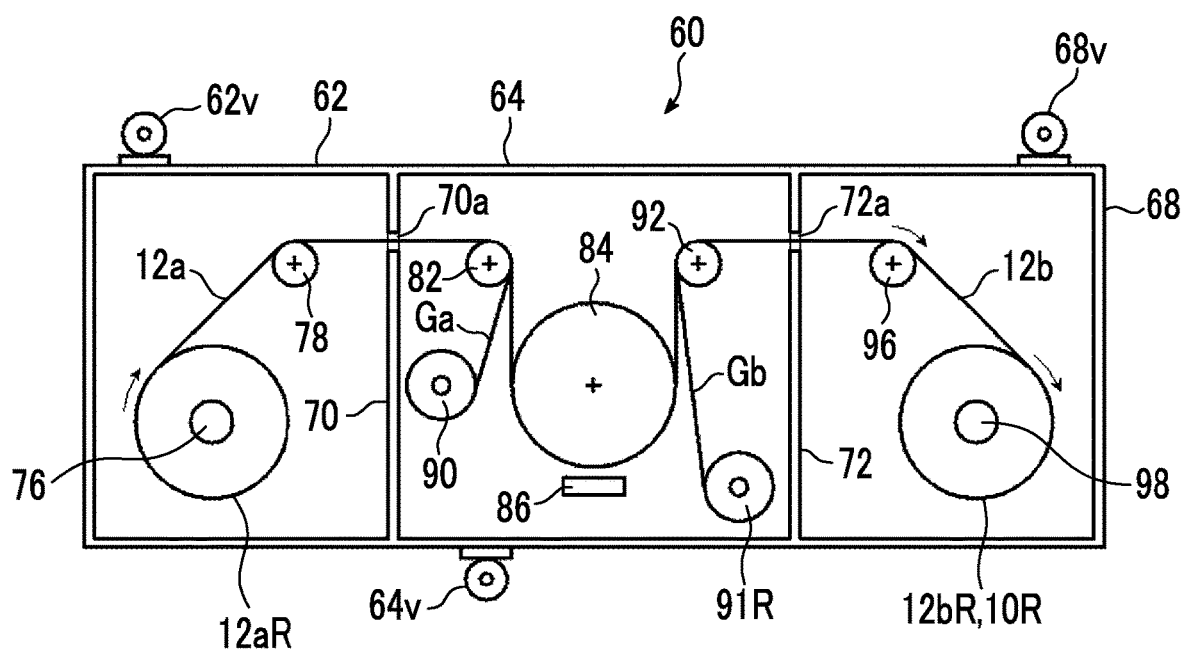
FIG. 4 is a view conceptually showing an example of an inorganic film forming apparatus for producing the gas barrier film of the present invention.

On the other hand, the apparatus shown in FIG. 4 is an inorganic film forming apparatus 60 which forms the inorganic layer 16. The inorganic film forming apparatus 60 is also an apparatus which forms the inorganic layer 16 by RtoR and which forms the inorganic layer 16 on the organic layer 24 of the substrate 12 while transporting the long substrate 12 on which the organic layer 24 is formed in the longitudinal direction.

The inorganic film forming apparatus 60 in the drawing has a supply chamber 62, a film forming chamber 64, and a winding chamber 68. The supply chamber 62 and the film forming chamber 64 are separated by a partition wall 70 having an opening 70a, and the film forming chamber 64 and the winding chamber 68 are separated by a partition wall 72 having an opening 72a, respectively.

<Formation of Peeling Resin Layer>

In a case of producing the gas barrier film 10, first, a substrate roll 12R formed by winding a long substrate 12 is loaded in the rotating shaft 50 to form the peeling resin layer 14 on the surface of the substrate 12.

In a case where the substrate roll 12R is loaded in the rotating shaft 50, the substrate 12 is pulled out from the substrate roll 12R, and passes through a predetermined transport path, from the transport roller pair 54 to the transport roller pair 56 through the coating section 42, the drying section 46, and the light irradiation section 48, thereby reaching the winding shaft 52.

The substrate 12 pulled out from the substrate roll 12R is transported to the coating section 42 by the transport roller pair 54, and the composition for forming the peeling resin layer 14 is applied onto the surface of the substrate 12.

The composition for forming the peeling resin layer 14 is a composition obtained by, as described above, dissolving the resin forming the peeling resin layer 14, and the like in a solvent (organic solvent). For example, in a case where the peeling resin layer 14 is formed of a polyarylate, a composition obtained by dissolving the polyarylate in a general-purpose ketone such as cyclohexanone is exemplified as the composition for forming the peeling resin layer 14.

In addition, as the coating of the composition in the coating section 42, various methods such as a die coating method, a dip coating method, an air knife coating method, a curtain coating method, a roller coating method, a wire bar coating method, and a gravure coating method can be used.

Next, the substrate 12 coated with the composition for forming the peeling resin layer 14 is heated in the drying section 46 to remove the solvent and dry the composition, thereby forming the peeling resin layer 14.

The drying section 46 has a drying section 46a which performs drying by heating from a front surface side (composition (a side of a surface on which the peeling resin layer 14 and the like are formed)), and a drying section 46b which performs drying by heating from a back surface side of the substrate 12, thereby performing the drying of composition from the front surface side and the back surface side.

It is sufficient that the heating in the drying section 46 is performed by a known method of heating a sheet-like material. For example, the drying section 46a on the front surface side is a warm air drying section, and the drying section 46b on the back surface side is a heat roller (guide roller having a heating mechanism).

A substrate 12a on which the peeling resin layer 14 is formed by the drying of composition passes through the light irradiation section 48 without any treatment, transported by the transport roller pair 56, and wound by the winding shaft 52 into a roll. Here, in the transport roller pair 56 of the organic film forming apparatus 40, a protective film Ga sent from a supply roll 49 is laminated on the peeling resin layer 14 to protect the peeling resin layer 14.

In a case where a peeling resin layer 14 having a predetermined length is formed, the peeling resin layer 14 is cut as necessary, supplied to the inorganic film forming apparatus 60 shown in FIG. 4 as a roll 12aR formed by winding the substrate 12a on which the peeling resin layer 14 is formed, and used for forming the inorganic layer 16.

<Formation of Inorganic Layer>

In the inorganic film forming apparatus 60, the roll 12aR is loaded in a rotating shaft 76 of the supply chamber 62.

In a case where the roll 12aR is loaded in the rotating shaft 76, the substrate 12 on which the peeling resin layer 14 is formed is pulled out, and passes through a predetermined path, from the supply chamber 62 to the winding chamber 68 through the film forming chamber 64, thereby reaching the winding shaft 58.

In a case where the substrate 12 has passed through a predetermined path, a vacuum exhaust unit 62v in the supply chamber 62, a vacuum exhaust unit 64v in the film forming chamber 64, and a vacuum exhaust unit 68v in the winding chamber 68 are driven so that the inside of the inorganic film forming apparatus 60 is set to be a predetermined pressure.

The substrate 12a on which the peeling resin layer 14 is formed and which is sent from the roll 12aR is guided by a guide roller 78 and transported to the film forming chamber 64.

The substrate 12a transported to the film forming chamber 64 is guided by a guide roller 82 and wound around a drum 84, and the inorganic layer 16 is formed on the substrate 12a by a film forming unit 86 according to, for example, CCP-CVD in a state that the substrate 12a is supported by the drum 84 and transported along a predetermined path. In a case of forming the inorganic layer 16, before the formation of the inorganic layer 16, the protective film Ga laminated on the peeling resin layer 14 is peeled off in the guide roller 82 and collected in a collection roll 90.

As described above, it is sufficient that the method for forming the inorganic layer 16 is performed, depending on the inorganic layer 16 to be formed, according to a known vapor deposition method such as plasma CVD, for example, CCP-CVD, ICP-CVD, and the like; sputtering, for example, magnetron sputtering, reactive sputtering, and the like; and vacuum vapor deposition. Among these, as described above, plasma CVD such as CCP-CVD is suitably used in the formation of the inorganic layer 16. Therefore, it is sufficient that the process gas to be used, the film forming conditions, and the like is appropriately set and selected depending on the thickness of the inorganic layer 16 to be formed, and the like.

A protective film roll 91R formed by winding a long protective film Gb is loaded in the film forming chamber 64.

In a substrate 12b on which the inorganic layer 16 (and the peeling resin layer 14) is formed, the protective film Gb pulled out from the protective film roll 91R is laminated on the inorganic layer 16 in a guide roller 92 to protect the inorganic layer 16.

The substrate 12b on which the inorganic layer 16 is formed is transported from the opening 72a to the winding chamber 68, guided by a guide roller 96, and wound by a winding shaft 98 into a roll to be a roll 12bR.

In a case where an inorganic layer 16 having a predetermined length is formed, purified dry air is introduced into all the chambers of the inorganic film forming apparatus 60 and the inorganic film forming apparatus 60 is open to the atmosphere. Thereafter, the substrate 12b is cut as necessary, and the roll 12bR is taken out from the winding chamber 68 of the inorganic film forming apparatus 60.

It is preferable that the method for producing a gas barrier film includes a step of forming an inorganic layer on the surface of the peeling resin layer according to the vapor deposition method, or a step of forming an inorganic layer on the surface of the peeling resin layer and at least two inorganic layers above the surface of the peeling resin layer according to the vapor deposition method.

<Formation of Adhesive Layer>

The roll 12bR formed by winding the substrate 12b on which the inorganic layer 16 is formed is loaded again in the rotating shaft 50 of the organic film forming apparatus 40 to form the adhesive layer 18 on the surface of the inorganic layer 16.

In a case where the roll 12bR is loaded in the rotating shaft 50, the same as described above, the substrate 12b is pulled out from the roll 12bR, and passes through the predetermined transport path, thereby reaching the winding shaft 52.

The substrate 12b pulled out from the roll 12bR is transported to the coating section 42 by the transport roller pair 54, and the surface of the substrate 12b is coated with a composition for forming the adhesive layer 18.

The composition for forming the adhesive layer 18 is a composition obtained by, as described above, dissolving the resin forming the adhesive layer 18, and the like in a solvent (organic solvent).

Next, the substrate 12 coated with the composition for forming the adhesive layer 18 is heated in the drying section 46 to remove the solvent and dry the composition, thereby forming the adhesive layer 18 and producing the gas barrier film 10.

In the same manner as described above, the gas barrier film 10 is transported by the transport roller pair 56, wound by the winding shaft 52 into a roll to be a gas barrier film roll 10R formed by winding the gas barrier film 10, and taken out from the organic film forming apparatus 40.

In the gas barrier film 10 according to the embodiment of the present invention, the protective film Ga sent from the supply roll 49 may be laminated on the adhesive layer in the transport roller pair 56 18 to protect the adhesive layer 18 as necessary, which is basically unnecessary because the adhesive layer 18 is solid at 50° C. or lower.

<Production of Organic/Inorganic Lamination-Type Gas Barrier Film>

In a case of producing the organic/inorganic lamination-type gas barrier film 20 as shown in FIG. 2, before the lamination of the adhesive layer 18, the organic layer 24 is formed on the surface of the inorganic layer 16 and inorganic layer 16 is formed on the surface of the organic layer 24 by the organic film forming apparatus 40.

In a case where the roll 12bR formed by winding the substrate 12bR on which the inorganic layer 16 is formed is loaded in the rotating shaft 50, the same as described above, the substrate 12b is pulled out from the substrate roll 12R, and passes through the predetermined transport path, thereby reaching the winding shaft 52.

The substrate 12b pulled out from the roll 12bR is transported to the coating section 42 by the transport roller pair 54, and the surface of the substrate 12b is coated with a composition for forming the organic layer 24.

The composition for forming the organic layer 24 is a composition including, as described above, a solvent, an organic compound (monomer, dimer, trimer, oligomer, polymer, and the like) forming the organic layer 24, a surfactant, a silane coupling agent, and the like.

Next, the substrate 12 coated with the composition for forming the organic layer 24 is heated in the drying section 46 to remove the solvent and dry the composition.

Next, the substrate 12b in which the composition for forming the organic layer 24 is dried is irradiated with ultraviolet rays or the like in the light irradiation section 48 to polymerize (crosslink) and cure the organic compound, thereby forming the organic layer 24. The organic compound for forming the organic layer 24 may be cured under an inert atmosphere such as a nitrogen atmosphere, as necessary.

The substrate on which the organic layer 24 is formed is transported by the transport roller pair 56, and wound by the winding shaft 52 into a roll. Here, in the transport roller pair 56 of the organic film forming apparatus 40, the protective film Ga sent from the supply roll 49 is laminated on the organic layer 24 to protect the organic layer 24.

In a case where an organic layer 24 having a predetermined length is formed, the organic layer 24 is cut as necessary and supplied to the inorganic film forming apparatus 60 shown in FIG. 4 as a roll formed by winding the substrate on which the organic layer 24 is formed, and the second inorganic layer 16 is formed in the same manner as described above.

In a case of producing the organic/inorganic lamination-type gas barrier film, such a formation of the organic layer 24 and the inorganic layer 16 is repeated according to the target number of combinations of the organic layer 24 and the inorganic layer 16, and after forming a predetermined number of combinations of the organic layer 24 and the inorganic layer 16, the adhesive layer 18 is formed on the surface of the uppermost inorganic layer 16, that is, the surface of the inorganic layer 16 most spaced from the substrate 12 in the same manner as described above, thereby forming an organic/inorganic lamination-type gas barrier film.

(Optical Element)

The optical element according to the embodiment of the present invention is an optical element in which the gas barrier film according to the embodiment of the present invention adheres to an optical element body with the adhesive layer 18, and as necessary, the substrate 12 is further peeled off therefrom.

FIG. 5 conceptually shows an example in which the optical element according to the embodiment of the present invention is used for an organic EL element (organic EL device).

In an optical element 30 shown in FIG. 5, an organic EL element body 32 is a known organic EL element (organic light emitting diode (OLED)) such as an organic EL display and an organic EL lighting device, which has a transparent electrode layer (thin film transistor (TFT)), a hole injection layer, a hole transport layer, a light emitting layer, a hole blocking layer, an electron transport layer, an electron injection layer, and a cathode.

By abutting, as described above, the adhesive layer 18 of the gas barrier film 10 to such an organic EL element body 32 and heating from the substrate 12 side, the optical element 30 has a configuration in which the adhesive layer 18 has fluidity, thereby exhibiting adhesiveness, and the gas barrier film 10 is stuck to the organic EL element body 32.

Alternatively, the optical element 30 has a configuration in which the gas barrier film is transferred to the organic EL element body 32 by cooling the adhesive layer 18 and peeling off the substrate 12 from the peeling resin layer 14 as necessary.

In the optical element according to the embodiment of the present invention, as the optical element body, various optical elements (optical devices) other than the organic EL element can be used.

Examples thereof include solar cells, quantum dot films, and various displays such as a liquid crystal display.

Among these, since the gas barrier film according to the embodiment of the present invention has little damage to the inorganic layer 16 and exhibits excellent gas barrier performance for a long time with high durability, the gas barrier film according to the embodiment of the present invention is suitably used for an organic EL element which is weak in moisture.

Hereinbefore, the gas barrier film, optical element, and method for producing a gas barrier film according to embodiments of the present invention has been described in detail, but the present invention is not limited to the above-described aspects and various improvements and changes can be made without departing from the spirit of the present invention.

For example, in the above-described method for producing a gas barrier film, all the layers are formed by RtoR as a preferred aspect, but at least one step may be performed batchwise after cutting the film, or all the steps may be performed batchwise with cut sheets.

EXAMPLES

Hereinafter, the present invention will be described in detail with reference to examples. The present invention is not limited to the following specific examples.

Example 1

As a substrate, a PET film manufactured by TOYOBO Co., Ltd., COSMOSHINE A4100; refractive index: 1.54) having a thickness of 100 μm and a width of 1000 mm was prepared.

A peeling resin layer (peeling layer) was formed on the substrate (PET film) using a general organic film forming apparatus, as shown in FIG. 3, for forming a film by a coating method according to RtoR.

First, a polyarylate (manufactured by UNITIKA LTD., UNIFINER M-2000H) and cyclohexanone were prepared and weighed such that the mass ratio was 5:95, and the polyarylate was dissolved in cyclohexanone at normal temperature to prepare a composition (resin composition) having a concentration of solid contents of 5% by mass. Tg of the used polyarylate was 275° C. (catalog value).

The composition was applied to the substrate (surface of the PET film which is not under-coated) using a die coater, and passed through a drying zone (drying section) of 130° C. The passing time of the drying zone was 3 minutes. Thereby, the composition was dried and cured to form the peeling resin layer (peeling layer) on a surface of the substrate.

After forming the peeling resin layer, a polyethylene protective film was laminated on the peeling resin layer and wound into a roll before contacting a first transport roller pair. The thickness of the peeling resin layer formed on the surface of the substrate was 2 μm.

Next, a silicon nitride (SiN) layer as an inorganic layer was formed on a surface of the peeling resin layer using a general inorganic film forming apparatus, as shown in FIG. 4, for forming a film by CCP-CVD according to RtoR.

A film forming chamber of the inorganic film forming apparatus had a film forming device by CCP-CVD, a drum serving as a counter electrode around which the substrate is wound and in which the substrate is transported, a guide roller peeling off the protective film laminated on the peeling resin layer, a collection roll winding up the peeled protective film, a roll loading section winding a long protective film, and a guide roller laminating the protective film on a surface of the formed inorganic layer.

As a raw material gas for forming the inorganic layer, silane gas (flow rate: 160 sccm), ammonia gas (flow rate: 370 sccm), hydrogen gas (flow rate: 590 sccm), and nitrogen gas (flow rate: 240 sccm) were used. As a high-frequency power source, a high-frequency power source with a frequency of 13.56 MHz was used, and a plasma excitation power was 2 kW. A film forming pressure was 40 Pa. A bias power of 0.2 kW was supplied to the drum using a high-frequency power source of 0.4 MHz.

Before forming the inorganic layer, the protective film laminated on the peeling resin layer was peeled off After forming the inorganic layer, a polyethylene protective film was laminated on the inorganic layer and wound into a roll by the guide roller which first contacted the inorganic layer.

The thickness of the formed inorganic layer was 20 nm.

Next, an adhesive layer was formed on a surface of the inorganic layer using a general organic film forming apparatus, as shown in FIG. 3, for forming a film by a coating method according to RtoR.

First, an acrylic homopolymer (manufactured by Taisei Fine Chemical Co., Ltd., 0415BA) was prepared and diluted with ethyl acetate to prepare a composition having a concentration of solid contents of 20% by mass. The acrylic homopolymer was amorphous, had Tg of 20° C., and had fluidity at 100° C., thereby exhibiting adhesiveness.

The composition was applied to the surface of the inorganic layer using a die coater, and passed through a drying zone of 80° C. The passing time of the drying zone was 3 minutes. Thereby, the composition was dried and cured to form the adhesive layer on the surface of the inorganic layer, and as a result, produce a gas barrier film.

Before applying the composition, the protective film laminated on the surface of the inorganic layer was peeled off. The thickness of the adhesive layer formed on the surface of the inorganic layer was 5 μm.

Example 2

A gas barrier film was produced in the same manner as in Example 1 except that the thickness of the peeling resin layer was 4 μm.

Example 3

A gas barrier film was produced in the same manner as in Example 1 except that the thickness of the peeling resin layer was 1 μm.

Example 4

A gas barrier film was produced in the same manner as in Example 1 except that the thickness of the peeling resin layer was 0.2 μm.

Example 5

A gas barrier film was produced in the same manner as in Example 1 except that the thickness of the adhesive layer was 20 μm.

Example 6

A gas barrier film was produced in the same manner as in Example 1 except that the thickness of the adhesive layer was 10 μm.

Example 7

A gas barrier film was produced in the same manner as in Example 1 except that the thickness of the adhesive layer was 2 μm.

Example 8

Aromatic polyimide (manufactured by MITSUBISHI GAS CHEMICAL COMPANY, INC., Neopulim-S) was prepared and diluted with toluene to prepare a composition having a concentration of solid contents of 5% by mass. Tg of the aromatic polyimide was 300° C.

A gas barrier film was produced in the same manner as in Example 1 except that the composition was used for forming the peeling resin layer.

Example 9

An acrylic homopolymer (manufactured by Taisei Fine Chemical Co., Ltd., 0415BA) and a urethane-acrylic copolymer (manufactured by Taisei Fine Chemical Co., Ltd., Acrit 8UA-347H) were weighed such that the mass ratio was 50:50, and diluted with methyl ethyl ketone such that a concentration of solid contents is 20% by mass to prepare a composition. A resin obtained by drying and curing the composition had Tg of 50° C. and had fluidity at 120° C., thereby exhibiting adhesiveness.

A gas barrier film was produced in the same manner as in Example 1 except that the composition was used for forming the adhesive layer.

Example 10

A polyester resin (manufactured by Nippon Synthetic Chemical Industry Ltd., Polyester SP-180) was prepared and dissolved in toluene to prepare a composition having a concentration of solid contents of 10% by mass.

The polyester resin was crystalline, had Tg of 10° C., and had fluidity at 120° C., thereby exhibiting adhesiveness.

A gas barrier film was produced in the same manner as in Example 1 except that the composition was used for forming the adhesive layer.

Example 11

Trimethylolpropane triacrylate (TMPTA, manufactured by DAICEL-ALLNEX LTD.) and a photopolymerization initiator (manufactured by Lamberti S.P.A., ESACURE KTO46) were prepared and weighed such that the mass ratio was 95:5, and dissolved in methyl ethyl ketone to prepare a composition for forming an organic layer, which has a concentration of solid contents of 15 by mass.

After forming the peeling resin layer and the inorganic layer in the same manner as in Example 1, the prepared composition was applied to the surface of the inorganic layer by a die coater using a general organic film forming apparatus, as shown in FIG. 3, according to RtoR, and passed through a drying zone of 50° C. The passing time of the drying zone was 3 minutes. Thereafter, the composition for forming an organic layer was cured by irradiating with ultraviolet rays (total irradiation dose: approximately 600 mJ/cm$^2$) to form an organic layer on the surface of the inorganic layer. The thickness of the organic layer was 1000 nm.

Using the organic layer as a base layer, an inorganic layer was formed on the organic layer in the same manner as the previously formed inorganic layer, and an adhesive layer was formed on the inorganic layer in the same manner as in Example 1.

Thereby, a gas barrier film having an organic and inorganic laminated structure which had a layer structure of "substrate-peeling resin layer-inorganic layer-organic layer-inorganic layer-adhesive layer" was produced.

Comparative Example 1

A gas barrier film was produced in the same manner as in Example 1 except that the peeling resin layer was not formed.

Comparative Example 2

An organic layer having a thickness of 1000 nm was formed on the surface of the peeling resin layer in the same manner as in Example 11 described above. An inorganic layer was formed on the surface of the organic layer in the same manner as in Example 1, and an adhesive layer was further formed in the same manner as in Example 1 to produce a gas barrier film.

That is, the gas barrier film had a layer structure of "substrate-peeling resin layer-organic layer-inorganic layer-adhesive layer".

Comparative Example 3

COC (manufactured by Polyplastics Co., Ltd., TOPAS 6017S-04) was prepared and dissolved in cyclohexane to prepare a composition having a concentration of solid contents of 10% by mass. Tg of this COC was 178° C.

A gas barrier film was produced in the same manner as in Example 1 except that the composition was used for forming the peeling resin layer.

Comparative Example 4

OCA (manufactured by PANAC Co., Ltd., PANACLEAN PD-S1 (thickness: 25 μm)) was prepared.

A gas barrier film was produced in the same manner as in Example 1 except that this OCA was used as the adhesive layer.

The sticking of OCA to the inorganic layer was performed as follows. First, a light-peeling separator of OCA was peeled off, and OCA was laminated on the inorganic layer. Next, a heavy-peeling separator of OCA was peeled off and transferred to a TAC film. Thereafter, the gas barrier film to which the TAC film was transferred was placed and treated in a vacuum assembly machine (manufactured by JOYO ENGINEERING CO., LTD.) to stick OCA to the inorganic layer.

[Evaluation]

Sheet-like samples were cut out from the long gas barrier films produced in Examples 1 to 11 and Comparative Examples 1 to 4.

Regarding the cut out gas barrier film, a water vapor transmission rate (WVTR) [g/(m$^2$·day)] of the gas barrier film was measured according to a calcium corrosion method (method described in JP2005-283561A) under the conditions of a temperature of 40° C. and a relative humidity of 90% RH (barrier property, before transfer).

Next, using a vacuum assembly machine (manufactured by JOYO ENGINEERING CO., LTD.), the gas barrier film and a TAC film were stuck with the adhesive layer facing the TAC film under the conditions of a pressure of 0.01 Pa and a substrate temperature of 105° C. In Example 9 and Example 10, the substrate temperature was 125° C. In addition, in Comparative Example 4, since the TAC film was already stuck, this treatment was omitted.

After taking out from the assembly machine, the substrate (PET film) was peeled off and the gas barrier film was transferred to the TAC film.

The water vapor transmission rate of the laminate of the gas barrier film and the TAC film was measured in the same manner as described above (barrier property, after transfer).

In addition, a total light transmittance of the laminate of the gas barrier film and the TAC film was measured using SH-7000 manufactured by NIPPON DENSHOKU INDUSTRIES Co., LTD. in accordance with JIS K 7361-1 (1996).

The laminate of the gas barrier film and the TAC film was allowed to stand under an environment of a temperature of 60° C. and a relative humidity of 90% RH for 500 hours, and the water vapor transmission rate was measured in the same manner as described above (barrier property, durability 500 hr).

In addition, the laminate of the gas barrier film and the TAC film was allowed to stand under an environment of a temperature of 60° C. and a relative humidity of 90% RH for 1000 hours, and the water vapor transmission rate was measured in the same manner as described above (barrier property, durability 1000 hr).

The results are shown in the table.

TABLE 1

|  |  |  |  | Example 1 | Example 2 | Example 3 | Example 4 | Example 5 |
|---|---|---|---|---|---|---|---|---|
| Film configuration | Substrate | | Material | PET | PET | PET | PET | PET |
| | | | Thickness [μm] | 100 | 100 | 100 | 100 | 100 |
| | Peeling layer | | Material | PAR | PAR | PAR | PAR | PAR |
| | | | Thickness [μm] | 2 | 4 | 1 | 0.2 | 2 |
| | | | Tg [° C.] | 275 | 275 | 275 | 275 | 275 |
| | Organic layer | | Material | — | — | — | — | — |
| | | | Thickness [μm] | | | | | |
| | Inorganic layer | | Material | SiN | SiN | SiN | SiN | SiN |
| | | | Thickness [μm] | 20 | 20 | 20 | 20 | 20 |
| | Organic layer | | Material | — | — | — | — | — |
| | | | Thickness [μm] | | | | | |
| | Inorganic layer | | Material | — | — | — | — | — |
| | | | Thickness [μm] | | | | | |
| | Adhesive layer | | Material | Acryl | Acryl | Acryl | Acryl | Acryl |
| | | | Thickness [μm] | 5 | 5 | 5 | 5 | 20 |
| | | | Flowing temperature [° C.] | 100 | 100 | 100 | 100 | 100 |
| | | | Tg [° C.] | 20 | 20 | 20 | 20 | 20 |
| | | | Crystalline/amorphous | Amorphous | Amorphous | Amorphous | Amorphous | Amorphous |
| Evaluation | Barrier property [g/m² · day] | | Before transfer | $1.8 \times 10^{-4}$ | $2.5 \times 10^{-4}$ | $1.4 \times 10^{-4}$ | $1.1 \times 10^{-4}$ | $1.8 \times 10^{-4}$ |
| | | | After transfer | $2.0 \times 10^{-4}$ | $2.5 \times 10^{-4}$ | $2.5 \times 10^{-4}$ | $2.8 \times 10^{-4}$ | $1.8 \times 10^{-4}$ |
| | | | Durability 500 hr | $2.1 \times 10^{-4}$ | $2.6 \times 10^{-4}$ | $2.7 \times 10^{-4}$ | $2.9 \times 10^{-4}$ | $1.8 \times 10^{-4}$ |
| | | | Durability 1000 hr | $2.3 \times 10^{-4}$ | $2.8 \times 10^{-4}$ | $2.9 \times 10^{-4}$ | $3.1 \times 10^{-4}$ | $1.9 \times 10^{-4}$ |
| | Total light transmittance [%] | | | 92 | 92 | 92 | 92 | 90 |

|  |  |  |  | Example 6 | Example 7 | Example 8 | Example 9 |
|---|---|---|---|---|---|---|---|
| Film configuration | Substrate | | Material | PET | PET | PET | PET |
| | | | Thickness [μm] | 100 | 100 | 100 | 100 |
| | Peeling layer | | Material | PAR | PAR | Polyimide | PAR |
| | | | Thickness [μm] | 2 | 2 | 2 | 2 |
| | | | Tg [° C.] | 275 | 275 | 300 | 275 |
| | Organic layer | | Material | — | — | — | — |
| | | | Thickness [μm] | | | | |
| | Inorganic layer | | Material | SiN | SiN | SiN | SiN |
| | | | Thickness [μm] | 20 | 20 | 20 | 20 |
| | Organic layer | | Material | — | — | — | — |
| | | | Thickness [μm] | | | | |
| | Inorganic layer | | Material | — | — | — | — |
| | | | Thickness [μm] | | | | |
| | Adhesive layer | | Material | Acryl | Acryl | Acryl | Mix |
| | | | Thickness [μm] | 10 | 2 | 5 | 5 |
| | | | Flowing temperature [° C.] | 100 | 100 | 100 | 120 |
| | | | Tg [° C.] | 20 | 20 | 20 | 50 |
| | | | Crystalline/amorphous | Amorphous | Amorphous | Amorphous | Amorphous |
| Evaluation | Barrier property [g/m² · day] | | Before transfer | $1.8 \times 10^{-4}$ | $1.8 \times 10^{-4}$ | $2.4 \times 10^{-4}$ | $1.8 \times 10^{-4}$ |
| | | | After transfer | $1.8 \times 10^{-4}$ | $2.4 \times 10^{-4}$ | $2.6 \times 10^{-4}$ | $1.8 \times 10^{-4}$ |
| | | | Durability 500 hr | $1.8 \times 10^{-4}$ | $2.5 \times 10^{-4}$ | $2.7 \times 10^{-4}$ | $1.8 \times 10^{-4}$ |
| | | | Durability 1000 hr | $1.9 \times 10^{-4}$ | $2.6 \times 10^{-4}$ | $2.8 \times 10^{-4}$ | $1.9 \times 10^{-4}$ |
| | Total light transmittance [%] | | | 91 | 93 | 91 | 92 |

|  |  |  |  | Example 10 | Example 11 | Comparative Example 1 | Comparative Example 2 | Comparative Example 3 | Comparative Example 4 |
|---|---|---|---|---|---|---|---|---|---|
| Film configuration | Substrate | | Material | PET | PET | PET | PET | PET | PET |
| | | | Thickness [μm] | 100 | 100 | 100 | 100 | 100 | 100 |
| | Peeling layer | | Material | PAR | PAR | — | PAR | COC | PAR |
| | | | Thickness [μm] | 2 | 2 | | 2 | 2 | 2 |
| | | | Tg [° C.] | 275 | 275 | | 275 | 178 | 275 |
| | Organic layer | | Material | — | — | — | TMPTA | — | — |
| | | | Thickness [μm] | | | | 1000 | | |
| | Inorganic layer | | Material | SiN | SiN | SiN | SiN | SiN | SiN |
| | | | Thickness [μm] | 20 | 20 | 20 | 20 | 20 | 20 |
| | Organic layer | | Material | — | TMPTA | — | — | — | — |
| | | | Thickness [μm] | | 1000 | | | | |
| | Inorganic layer | | Material | — | SiN | — | — | — | — |
| | | | Thickness [μm] | | 20 | | | | |

TABLE 1-continued

|  |  |  | Polyester | Acryl | Acryl | Acryl | Acryl | OCA |
|---|---|---|---|---|---|---|---|---|
| | Adhesive layer | Material | Polyester | Acryl | Acryl | Acryl | Acryl | OCA |
| | | Thickness [μm] | 5 | 5 | 5 | 5 | 5 | 25 |
| | | Flowing temperature [° C.] | 120 | 100 | 100 | 100 | 100 | — |
| | | Tg [° C.] | 10 | 20 | 20 | 20 | 20 | — |
| | | Crystalline/amorphous | Crystalline | Amorphous | Amorphous | Amorphous | Amorphous | Amorphous |
| Evaluation | Barrier property [g/m² · day] | Before transfer | $2.1 \times 10^{-4}$ | $2.3 \times 10^{-3}$ | $1.8 \times 10^{-2}$ | $3.0 \times 10^{-3}$ | $5.0 \times 10^{-3}$ | $1.8 \times 10^{-4}$ |
| | | After transfer | $2.5 \times 10^{-4}$ | $2.4 \times 10^{-5}$ | 2.0 | $3.5 \times 10^{-3}$ | $7.0 \times 10^{-3}$ | $2.3 \times 10^{-2}$ |
| | | Durability 500 hr | $2.6 \times 10^{-4}$ | $2.7 \times 10^{-3}$ | 2.0 | $4.0 \times 10^{-3}$ | $8.9 \times 10^{-3}$ | $2.5 \times 10^{-2}$ |
| | | Durability 1000 hr | $2.7 \times 10^{-4}$ | $2.7 \times 10^{-3}$ | 2.0 | $4.5 \times 10^{-3}$ | $1.5 \times 10^{-2}$ | $2.7 \times 10^{-2}$ |
| | Total light transmittance [%] | | 90 | 88 | 89 | 92 | 91 | 92 |

PAR in the peeling layer represents a polyarylate resin.
Acryl in the adhesive layer represents a homoacrylic polymer, and Mix represents a mixture of a homoacrylic polymer and a urethane-acrylic copolymer.

As shown in the table, the gas barrier films of Examples 1 to 11 have high gas barrier property, have less deterioration in gas barrier property after peeling and transfer, and further have less deterioration in gas barrier property even in a case of being allowed to stand under a high temperature and high humidity environment with a temperature of 60° C. and a relative humidity of 90% RH. In particular, in Example 9 in which the adhesive layer is formed of a mixture of the acrylic homopolymer and the urethane-acrylic copolymer, although it is required to heat at a higher temperature than other examples, the deterioration in gas barrier property after transfer is very small, and more excellent high temperature and high humidity durability is exhibited.

In Examples 5 and 6 in which the adhesive layers are 20 μm and 10 thicker than other examples, since adhesiveness is good, the deterioration in gas barrier property after transfer is very small.

As can be seen from the comparison of Example 1 and Example 10, good transparency can be obtained by using amorphous adhesion. In addition, as can be seen from the comparison of Example 1 and Example 8, good gas barrier property can be obtained by using a polyarylate for the peeling resin layer (peeling layer).

Furthermore, as shown in Example 11, a higher gas barrier property can be obtained by further having the laminated structure of an organic layer and an inorganic layer on the inorganic layer.

In Comparative Example 1 which does not have the peeling resin layer, since appropriate peelability cannot be ensured, gas barrier property is significantly reduced by performing the peeling and transfer.

In addition, in any of Comparative Example 2 which has the organic layer between the peeling resin layer and the inorganic layer, Comparative Example 3 in which the peeling resin layer does not have an aromatic ring, and Comparative Example 4 in which the adhesive layer is OCA, gas barrier property is reduced in comparison with the gas barrier films of Examples 1 to 11, and further, the deterioration in gas barrier property after transfer and the deterioration in gas barrier property after being allowed to stand under a high temperature and high humidity environment are also large.

From the above results, the effect of the present invention is clear.

The present invention can be suitably used as a sealing material for organic EL elements, solar cells, and the like.

EXPLANATION OF REFERENCES 10, 20: gas barrier film
10R: gas barrier film roll
12, 12a, 12b: substrate
12aR, 12bR: roll
14: peeling resin layer
16: inorganic layer
18: adhesive layer
24: organic layer
32: organic EL element body
40: organic film forming apparatus
42: coating section
46, 46a, 46b: drying section
48: light irradiation section
50, 76: rotating shaft
52, 98: winding shaft
54, 56: transport roller pair
60: inorganic film forming apparatus
62: supply chamber
62v, 64v, 68v: vacuum exhaust unit
64: film forming chamber
68: winding chamber
70, 72: partition wall
70a, 72a: opening
78, 82, 96: guide roller
84: drum
86: film forming unit
90: collection roll
92: guide roller
94: heating unit
Ga: protective film

What is claimed is:

1. A gas barrier film comprising:
a substrate;
a peeling resin layer which is provided on one surface of the substrate and from which the substrate can be peeled off;
at least one inorganic layer; and
an adhesive layer provided on a surface of a layer of the at least one inorganic layer, the layer being most spaced from the substrate and the surface being opposite to a side of the substrate,
wherein a layer of the at least one inorganic layer, which is nearest to the substrate is provided on a surface of the peeling resin layer, which is opposite to a side of the substrate,
the peeling resin layer is a resin layer having an aromatic ring,
the adhesive layer is a resin layer having an amorphous resin as a main component,
the amorphous resin is an acrylic resin, and
the adhesive layer is solid at normal temperature and has fluidity by heating, thereby exhibiting adhesiveness.

2. The gas barrier film according to claim 1, wherein the adhesive layer has fluidity at 50° C. to 200° C., thereby exhibiting adhesiveness.

3. The gas barrier film according to claim 1, wherein a glass transition point of the peeling resin layer is 180° C. or higher.

4. The gas barrier film according to claim 1, wherein the peeling resin layer includes a bisphenol structure.

5. The gas barrier film according to claim 1, wherein the peeling resin layer includes a polyarylate.

6. The gas barrier film according to claim 1, wherein a thickness of the peeling resin layer is 0.2 to 4 µm.

7. The gas barrier film according to claim 1, wherein a glass transition point of the adhesive layer is 130° C. or lower.

8. The gas barrier film according to claim 1, wherein a thickness of the adhesive layer is 1 to 30 µm.

9. The gas barrier film according to claim 1, wherein the acrylic resin is a resin obtained by polymerizing a single acrylate monomer.

10. The gas barrier film according to claim 1, wherein the adhesive layer includes one or more of a styrene-acrylic copolymer, a urethane-acrylic copolymer, and an acrylic resin for adjusting a glass transition point.

11. The gas barrier film according to claim 1, wherein the adhesive layer is a layer consisting of the acrylic resin obtained by polymerizing a single acrylate monomer.

12. The gas barrier film according to claim 1, wherein the substrate is peeled off from the peeling resin layer.

13. The gas barrier film according to claim 1, further comprising:
at least one set of a combination of an inorganic layer, which is different from the inorganic layer formed on the surface of the peeling resin layer, and an organic layer, which is a base of the inorganic layer different from the inorganic layer formed on the surface of the peeling resin layer, between the inorganic layer formed on the surface of the peeling resin layer and the adhesive layer.

14. An optical element, wherein the gas barrier film according to claim 1 is stuck to a surface of an optical element body.

15. The optical element according to claim 14, wherein the optical element body is an organic electroluminescence element.

16. A gas barrier film comprising:
a substrate;
a peeling resin layer which is provided on one surface of the substrate and from which the substrate can be peeled off;
at least one inorganic layer; and
an adhesive layer provided on a surface of a layer of the at least one inorganic layer, the layer being most spaced from the substrate and the surface being opposite to a side of the substrate,
wherein a layer of the at least one inorganic layer, which is nearest to the substrate is provided on a surface of the peeling resin layer, which is opposite to a side of the substrate,
the peeling resin layer is a resin layer having an aromatic ring,
the adhesive layer is solid at normal temperature and has fluidity by heating, thereby exhibiting adhesiveness,
the adhesive layer has fluidity at 50° C. to 200° C., thereby exhibiting adhesiveness,
a glass transition point of the peeling resin layer is 180° C. or higher,
the peeling resin layer includes a polyarylate,
a thickness of the peeling resin layer is 0.2 to 4 µm,
a glass transition point of the adhesive layer is 130° C. or lower,
a thickness of the adhesive layer is 1 to 30 µm,
the adhesive layer is a resin layer having an amorphous resin as a main component,
the amorphous resin is an acrylic resin is obtained by polymerizing a single acrylate monomer, and
the adhesive layer includes one or more of a styrene-acrylic copolymer, a urethane-acrylic copolymer, and an acrylic resin for adjusting a glass transition point.

17. A method for producing a gas barrier film, the method comprising:
forming a peeling resin layer capable of peeling off a substrate by applying a composition obtained by dissolving a resin having an aromatic ring in a solvent onto a surface of the substrate, and drying the composition;
forming at least one inorganic layer according to a vapor deposition method, the step including a formation of the at least one inorganic layer on a surface of the peeling resin layer; and
forming an adhesive layer by applying a composition obtained by dissolving, in a solvent, a resin which is solid at normal temperature and has fluidity by heating, thereby exhibiting adhesiveness, onto a surface of the inorganic layer most spaced from the substrate, and drying the composition.

18. The method for producing a gas barrier film according to claim 17, wherein the vapor deposition method is plasma CVD.

* * * * *